(12) United States Patent
Crawford et al.

(10) Patent No.: US 8,451,877 B1
(45) Date of Patent: May 28, 2013

(54) HIGH EFFICIENCY III-NITRIDE LIGHT-EMITTING DIODES

(75) Inventors: Mary Crawford, Albuquerque, NM (US); Daniel Koleske, Albuquerque, NM (US); Jaehee Cho, Troy, NY (US); Di Zhu, Troy, NY (US); Ahmed Noemaun, Troy, NY (US); Martin F. Schubert, Boise, ID (US); E. Fred Schubert, Troy, NY (US)

(73) Assignee: Sandia Corporation, Albuquerque, NM (US)

( * ) Notice: Subject to any disclaimer, the term of this patent is extended or adjusted under 35 U.S.C. 154(b) by 104 days.

(21) Appl. No.: 13/050,673

(22) Filed: Mar. 17, 2011

Related U.S. Application Data (60) Provisional application No. 61/316,518, filed on Mar. 23, 2010.

(51) Int. Cl.
*H01S 5/00* (2006.01)
*H01S 5/34* (2006.01)
*H01S 5/20* (2006.01)
*H01S 5/183* (2006.01)

(52) U.S. Cl.
CPC ............. *H01S 5/3413* (2013.01); *H01S 5/2018* (2013.01); *H01S 5/18308* (2013.01)
USPC .................. 372/46.016; 372/45.01; 372/46.01

(58) Field of Classification Search
CPC .................................................... H01S 5/3413
USPC ................................ 372/46.016, 46.01, 45.01
See application file for complete search history.

(56) References Cited

U.S. PATENT DOCUMENTS

| | | | |
|---|---|---|---|
| 6,288,416 B1 * | 9/2001 | Koike et al. ..................... | 257/94 |
| 2007/0181869 A1 * | 8/2007 | Gaska et al. .................... | 257/14 |
| 2009/0283746 A1 * | 11/2009 | Chua et al. ...................... | 257/13 |

OTHER PUBLICATIONS

Chichibu, Shigefusa F., Optical and structural studies in InGaN quantum well structure laser diodes, J. Vac. Sci, Technol. B. vol. 19, No. 6 Nov./Dec. 2001, 2177-2183.

Dai, Qi, On the symmetry of efficiency-versus-carrier-concentration curves in GaInN/GaN light-emitting diodes and relation to droop-causing mechanisms, Applied Physics Letters 98, 033506, 2001.

David, Aurelien, Carrier distribution in (0001) in GaN/GaN multiple quantum well light-emitting diodes, Applied Physics Letters 92, 053502, 2008.

David, Aurelien, Efficiency Droop in III-Nitride LEDs: overview and carrier lifetime analysis, NUSOD 2010, IEEE 2010, pp. 87-88.

Efremov, A.A., Effect of the Joule Heating on the Quantum Efficiency and Choice of Thermal Conditions for High-Power Blue InGaN/GaN LEDs, Semiconductors, vol. 40, No. 5, 2006, 605-610.

Gardner, N. F., Blue-emitting inGaN—Gan double-heterostructure light-emitting diodes reaching maximum quantum efficiency above 200 A/cm2, Applied Physics Lettters, 91, 243506 (2007).

(Continued)

*Primary Examiner* — Kinam Park
(74) *Attorney, Agent, or Firm* — Kevin W. Bieg (57) ABSTRACT

Tailored doping of barrier layers enables balancing of the radiative recombination among the multiple-quantum-wells in III-Nitride light-emitting diodes. This tailored doping enables more symmetric carrier transport and uniform carrier distribution which help to reduce electron leakage and thus reduce the efficiency droop in high-power III-Nitride LEDs. Mitigation of the efficiency droop in III-Nitride LEDs may enable the pervasive market penetration of solid-state-lighting technologies in high-power lighting and illumination.

13 Claims, 6 Drawing Sheets

OTHER PUBLICATIONS

Kim, Min-Ho, Origin of efficiency droop in GaN-based light-emitting diodes, Applied Physics Letters, 91 183507, (2007).

Kim, A. Y., Performance of High-Power AlInGaN Light Emitting Diodes, Phys. Stat. Sol. (a) 188, No. 1, 15-21 (2001).

Peter, M., Green ThinGaN power-LED demonstrates 100 lm, Physica Status Solidi (c) 5, No. 6 (2008) 2050-2052.

Pope, I.A., Carrier leakage in InGaN quantum well light-emitting diodes emitting at 480 nm. Applied Physics Letters, vol. 82, No. 17, Apr. 28, 2003, 2755-2757.

Reed, M. L., n-InGaN/p-GaN single heterostructure light emitting diode with p-side down, Applied Physics Letters, 93, 133505 (2008).

Rozhansky, I. V., Analysis of processes limiting quantum efficiency of AlGaInN LEDs at high pumping, Phys. Stat. Sol. (a) 204, No. 1, 227-230 (2007).

Schubert, M. F., Effect of dislocation density on efficiency droop in GaInN/GaN light-emitting diodes, Applied Physics Letters, 91, 231114, (2007).

Schubert, M. F., Polarization-matched GaInN/AlGaInN multi-quantum-well light-emitting diodes with reduced efficiency droop, Applied Physics Letters 93, 041102, (2008).

Shen, Y.C., Auger recombination in InGAN measured by photoluminescence, Applied Physics Letters 91, 141101, (2007).

Slanton, N. M., Energy relaxation by hot electrons in n-GaN epilayers, Journal of Applied Physics, vol. 89, No. 2, Jan. 15, 2001, 973-979.

Xie, Jinqiao, On the efficiency droop in InGaN multiple quantum well blue light emitting diodes and its reduction with p-doped quantum well barriers, Applied Physics Letters, 93, 121107 (2008).

Xu, Jiuru, Reduction in efficiency droop, forward voltage, ideality factor, and wavelength shift in polarization-matched GaInN/GaInN multi-quantum-well tight-emitting diodes, Applied Physics Letters, 94, 011113, (2009).

Ye, Hong, Hot electron relaxation time in GaN, Applied Physics Letters. vol. 74, No. 5, Feb. 1, 1939, 711-713.

Zhu, Di, The origin of the high diode-ideality factors in GaInN/GaN multiple quantum well light-emitting diodes, Applied Physics Letters, 94, 081113, (2009).

Zhu, Di, Enhanced electron capture and symmetrized carrier distribution in GaInN light-emitting diodes having tailored barrier doping, Applied Physics Letters, 96, 121110, (2010).

\* cited by examiner

HIGH EFFICIENCY III-NITRIDE LIGHT-EMITTING DIODES

CROSS-REFERENCE TO RELATED APPLICATION

This application claims the benefit of U.S. Provisional Application No. 61/316,518, filed Mar. 23, 2010, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to light-emitting diodes and, in particular, to III-Nitride light-emitting diodes that use tailored doping of quantum barriers to symmetrize carrier transport and achieve uniform carrier distribution among multiple-quantum-wells, thereby helping to reduce electron leakage and thus reduce efficiency droop at high injection currents.

BACKGROUND OF THE INVENTION

Light-emitting diodes (LEDs) are used in a wide variety of applications, including in high-power lighting and illumination. LEDs present many advantages over conventional incandescent sources for lighting and illumination, including lower energy consumption, longer lifetime, improved robustness, smaller size, faster switching, and greater durability and reliability. In particular, there is ongoing research to develop blue light-emitting diodes that can be mixed with red and green LEDs or can be used to excite a phosphor material to form white light for general lighting applications. Low-power LEDs, typically operating at a few milliamps, have been shown to have high luminous efficacy of greater than 100 lm/W. However, practical general lighting requires high-power LEDs capable of one watt or more. Typical operating currents for such high-power LEDs are several hundred mA to more than an ampere. A recurring problem with LEDs is the gradual decrease of the power efficiency as the injection current increases, an effect known as "efficiency droop."

In particular, efficiency droop has been shown to be a unique characteristic of GaN-based multiple-quantum-well (MQW) LEDs. The origin of the high-power loss mechanism remains under active investigation. Several loss mechanisms have been suggested, including electron leakage out of the MQW active region, low hole injection, Auger recombination, carrier delocalization occurring at high excitation intensities, and junction heating. See M. H. Kim et al., *Appl. Phys. Lett.* 91, 183507 (2007); M. F. Schubert et al., *Appl. Phys. Lett.* 91, 231114 (2007); M. F. Schubert et al., *Appl. Phys. Lett.* 93, 041102 (2008); J. Xie et al., *Appl. Phys. Lett.* 93, 121107 (2008); I. V. Rozhansky and D. A. Zakheim, *Phys. Status Solidi A* 204, 227 (2007); I. A. Pope et al., *Appl. Phys. Lett.* 82, 2755 (2003); Y. C. Shen et al., *Appl. Phys. Lett.* 91, 141101 (2007); N. F. Gardner et al., *Appl. Phys. Lett.* 91, 243506 (2007); A. Y. Kim et al., *Phys. Status Solidi A* 188, 15 (2001); S. F. Chichibu et al., *J. Vac. Sci. Technol. B* 19, 2177 (2001); and A. A. Efremov et al., *Semiconductors* 40, 605 (2006). For blue LEDs injected with high current densities, the physical mechanism causing the efficiency droop was found to be the single largest loss mechanism. See M. F. Schubert et al., *Appl. Phys. Lett.* 91, 231114 (2007).

Therefore, a need remains for the mitigation of the efficiency droop GaN-based and other III-Nitride LEDs that may enable the pervasive market penetration of solid-state-lighting technologies.

SUMMARY OF THE INVENTION

The present invention is directed to a III-Nitride (III-N) light-emitting diode, comprising a multiple-quantum-well active region, comprising a plurality of alternating barrier layers surrounding central quantum well layers, wherein at least two of the plurality of alternating barrier layers are doped with different donor impurity concentrations. The central quantum well layers can comprise GaN, InGaN, AlGaN, or AlInGaN. The barrier layers can comprise GaN, GaInN, AlGaN, or AlGaInN. The donor impurity can comprise a group IV element, such as silicon or germanium. The different donor impurity concentrations of the alternating barrier layers can be tailored to symmetrize carrier transport and achieve uniform carrier distribution among the MQWs. The different donor impurity concentrations can range from undoped up to about $10^{19}$ cm$^{-3}$. The donor impurity concentrations within the barrier layers can be graded. The III-N light-emitting diode can further comprise an n-type layer cladding a side of the active region and a p-type layer cladding the other side of the active region. The p-type cladding layer can comprise p-type GaN and the n-type cladding layer can comprise n-type GaN. An n-side barrier layer can be doped with a higher donor impurity concentration than the adjacent p-side barrier layer. The barrier layer closest to the p-type cladding layer can be undoped.

The confinement of electrons to the active region of III-N LEDs is limited by the: inefficient electron capture into polar quantum wells, electron-attracting properties of electron-blocking layer, asymmetry in electron and hole transport, and unfavorable p-doping in the AlGaN electron-blocking layer for high Al content. To counteract these mechanisms, the present invention uses tailored doping in the quantum barriers of a multiple-quantum-well III-N LED. This tailored doping enables balancing of the radiative recombination among the multiple-quantum-wells. This result can be attributed to a more symmetric carrier transport and uniform carrier distribution which help to reduce electron leakage and thus reduce the efficiency droop.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Figure 1:
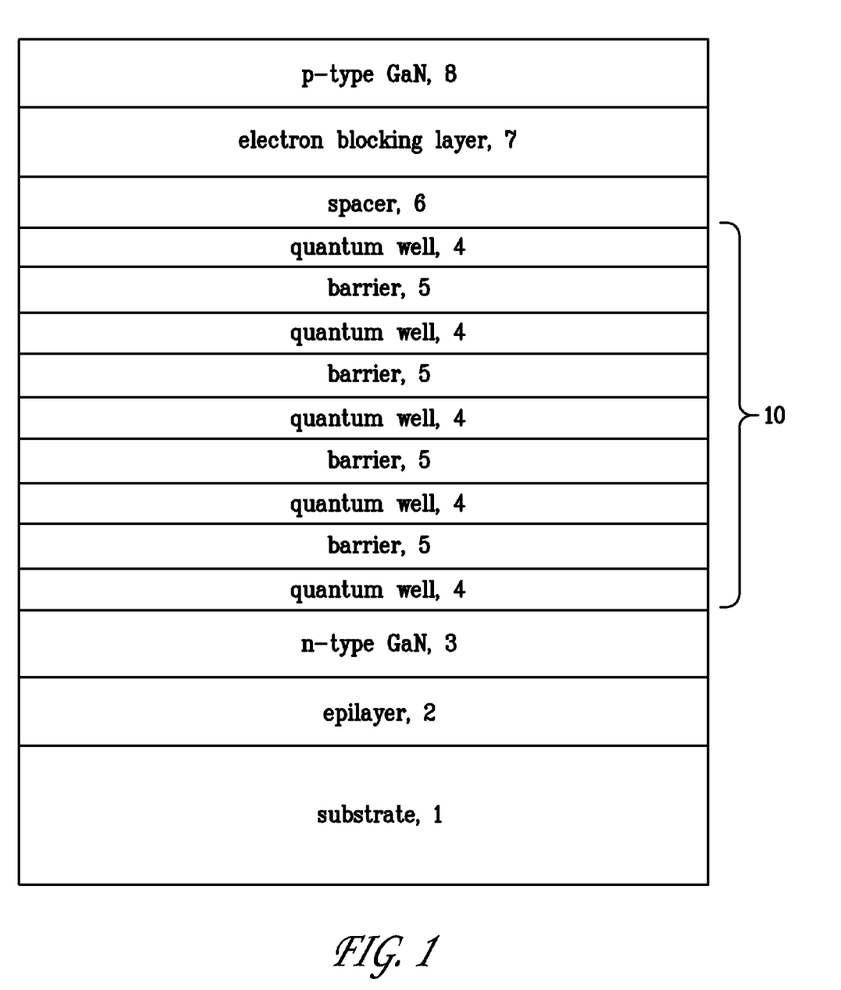
FIG. 1 shows a typical multiple-quantum-well heterostructure of an exemplary GaN-based LED.

FIG. 1 shows a typical MQW heterostructure of a gallium-nitride-based LED. This exemplary p-side up device is built on a substrate 1, such as sapphire, that is suitable for epitaxial growth of the heterostructure. An undoped GaN epilayer 2 is grown on the sapphire substrate to enable the growth of smooth, crystalline heterostructure films. An n-type GaN layer 3, comprising GaN doped with a group IV donor impurity, such as silicon, is grown on the epilayer 2. This n-type layer 3 serves as a source of electrons. In this example, a five MQW active region 10 is then grown on the n-type GaN layer 3, comprising a plurality of alternating quantum barrier (QB) layers 5 surrounding central quantum well (QW) layers 4. For example, the QWs 4 can comprise GaN, InGaN, AlGaN, or AlInGaN. For example, the color of the light emitted from the active region 10 can be controlled by varying the gallium-to-indium ratio in InGaN QWs. For example, the barrier layers 5 can comprise GaN, GaInN, AlGaN, or AlGaInN, so long as the bandgap of the barrier layers is larger than the quantum well layer in the MQW active region 10. According to the present invention, the barrier layers 5 can be doped with a group IV donor impurity (e.g., Si) in such a way as to symmetrize carrier transport and achieve uniform carrier distribution among multiple-quantum-wells, thereby helping to reduce electron leakage and thus reduce efficiency droop at high injection currents. A spacer layer 6 can be grown on the last (p-side) quantum well. A p-type AlGaN electron-blocking-layer (EBL) 7 can be grown on the spacer layer 6. Finally, a p-type GaN cladding layer 8, comprising GaN doped with a group II acceptor impurity, such as zinc or magnesium, is grown on the electron-blocking-layer. This p-type GaN cladding layer 8 provides a source of excess positive-charge carrying holes. The blocking layer 7 tends to prevent electrons from leaking out of the wells and recombining with holes in the p-type GaN cladding layer 8, resulting in poor hole injection into the light-emitting QWs 4. When a voltage is applied to the n- and p-type GaN layers 3 and 8, electrons and holes are injected into and become captured in the quantum wells 4, maximizing the likelihood that they will radiatively recombine and emit a photon.

Figure 2A:
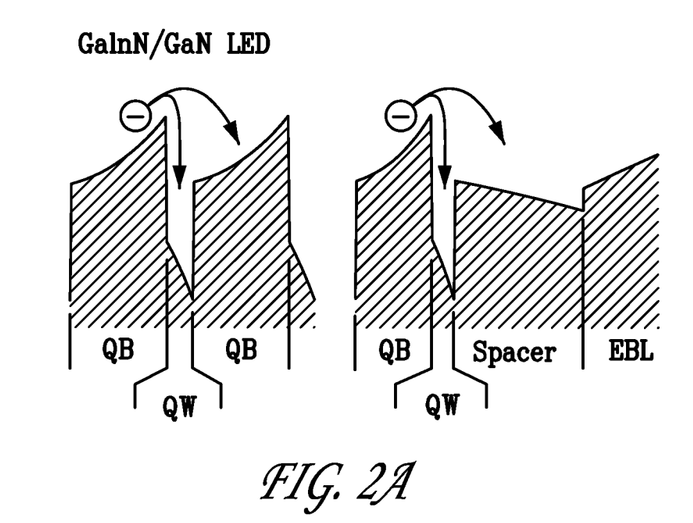
FIG. 2(a) shows band diagrams and energy loss of electrons injected into a regular quantum well (QW) and into the very last QW (located next to the electron-blocking layer, EBL) of a GaN-based LED.
Figure 2B:
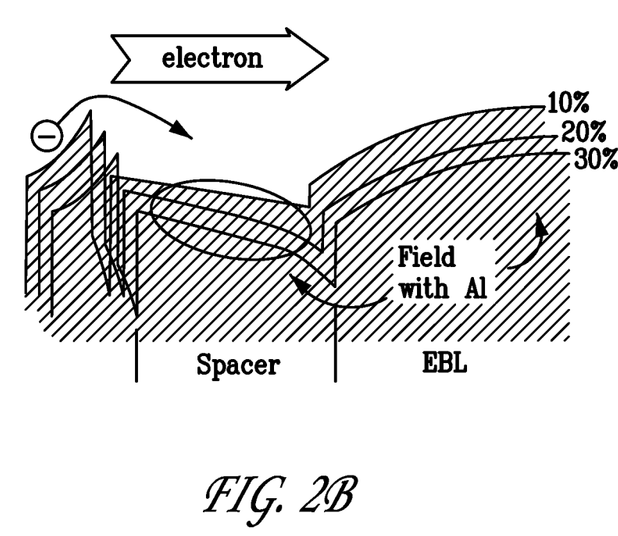
FIG. 2(b) shows simulated band diagrams showing increasing field in the spacer layer and increasing positive sheet charge at the spacer-to-EBL interface as the EBL Al content increases from 10% to 20% to 30%.

The polarization properties of an exemplary GaInN heterostructure can strongly impact carrier transport in ways that likely contribute to efficiency droop. Electron leakage out of the active region can be caused by insufficient electron capture into QWs, especially for polar GaInN QWs with unequal QB heights. This is illustrated in FIG. 2(a), which shows band diagrams and energy loss of electrons injected into a regular QW and into the very last QW (located next to the EBL). From a semi-classical view, for an electron to be captured when propagating through a QW, its energy-loss rate (dE/dx) must exceed the potential drop across the QW, that is $dE/dx|_{LO-phonon} > e\mathcal{E}_{QW}$ where $\mathcal{E}_{QW}$ is the polarization field in the QW. Assuming that electrons propagate at saturation velocity ($1\times10^7$ cm/s), one can estimate the energy lost by emission of LO phonons ($h\nu_{LO}=92$ meV) with a phonon emission lifetime of $\tau_{LO}=10$-200 fs. See N. M. Stanton et al., J. Appl. Phys. 89, 973 (2001); and H. Ye et al., Appl. Phys. Lett. 74, 711 (1999). For a QW width of $L_{QW}=3$ nm, one obtains $dE/dx|_{LO-phonon} < e\mathcal{E}_{QW}$ indicating that capture of electrons may be difficult. This is particularly relevant for the last (p-side) QW because of the electron-extracting down-sloped band edge of the spacer layer adjoining the right-hand side of the last QW. For non-polarized structures, any energy loss will suffice to capture an electron since $\mathcal{E}_{QW}=0$. Accordingly, polarization-matched GaInN/AlGaInN and GaInN/GaInN structures have been demonstrated with higher light-output power and less efficiency droop at high currents. See M. F. Schubert et al., Appl. Phys. Lett. 93, 041102 (2008); and J. Xu et al., Appl. Phys. Lett. 94, 011113 (2009). A positive sheet charge exists at the spacer-to-electron-blocking-layer interface due to spontaneous and piezoelectric polarization effects. The corresponding electric field in the spacer layer attracts electrons and drives them out of the active region towards the EBL. FIG. 2(b) depicts simulated band diagrams showing increasing field in the spacer layer and increasing positive sheet charge at the spacer-to-EBL interface as the EBL Al contents increases from 10% to 20% to 30%. Decreasing electron leakage by increasing the Al content in the EBL is counteracted by the simultaneously increasing positive sheet charge at the active-region-EBL interface which further promotes electron extraction.

In addition to these polarization-induced effects, the low hole mobility in GaN (~10 cm$^2$/Vs) and the more favorable values for electrons (~300 cm$^2$/Vs), in conjunction with the large thermal activation energy for acceptor ionization (~200 meV), result in an inherent asymmetry in electron and hole transport. This asymmetry causes electrons to more easily traverse the MQW active region than holes and reduces hole injection into the active region. As a result, the distribution of electrons and holes within the MQW was found to be highly non-uniform with the p-side end of the MQW active region contributing the majority of radiative recombination events. See A. David et al., Appl. Phys. Lett. 92, 053502 (2008). Thus, while polarization-matched structures have demonstrated reduced efficiency droop and other benefits, carrier transport remains strongly asymmetric in such structures; it cannot be fully counteracted by increasing the Al content in the EBL due to the lower p-type doping efficiency at high Al contents. See M. F. Schubert et al., Appl. Phys. Lett. 93, 041102 (2008); and J. Xu et al., Appl. Phys. Lett. 94, 011113 (2009).

Based on these reasons, it can be concluded that the last QW is indeed a "problem QW" that causes electrons to leak away, thereby contributing to the efficiency droop. This motivates the pursuit of "inverted" LED structures (n-side-up growth or growth on N-face surfaces), polarization-matched LED structures, wider QW LED structures, and other LED structures that prevent carriers from recombining mostly in the last QW. See M. L. Reed et al., *Appl. Phys. Lett.* 93, 133505 (2008); M. F. Schubert et al., *Appl. Phys. Lett.* 93, 041102 (2008); A. David et al., *Appl. Phys. Lett.* 92, 053502 (2008); Y. C. Shen et al., *Appl. Phys. Lett.* 91, 141101 (2007); and M. Peter et al., *Phys. Stat. Solidi C* 5, 2050 (2008).

The present invention solves this electron/hole transport asymmetry by "tailoring" the doping profile in the QBs. Tailoring the doping profile in the QBs according to the present invention can dramatically enhance the light-output power and reduce the efficiency droop of nitride LEDs. Si-doped QBs, in general, have been widely used in conventional GaInN LEDs and previous studies have indicated that the carrier transport characteristics and the device ideality factor have close relationships with Si doping of the QBs. See M. Koike and S. Asami, U.S. Pat. No. 6,288,416 (1999); and D. Zhu et al., *Appl. Phys. Lett.* 94, 081113 (2009). In particular, the latter study found that undoped barriers lead to increased ideality factors and thus higher voltages under current injection. The study showed that uniformly-doped QBs can be used to obtain a low diode-ideality factor and a low forward voltage in the LEDs. Conversely, the present invention uses non-uniformly doped QBs to obtain a uniform carrier distribution in the MQWs and lower efficiency droop, while minimizing the detrimental impact on the forward voltage that is applied to the LED.

Carrier transport, distribution, recombination, and efficiency droop in GaInN LEDs with different numbers of doped QBs were investigated as examples of the present invention. The four GaInN/GaN MQW LEDs used in this investigation were grown on sapphire substrates by metal-organic vapor-phase epitaxy. The GaInN/GaN MQW active region consisted of five 2.5-nm-thick $Ga_{0.85}In_{0.15}N$ QWs with four 8.2-nm-thick GaN QBs in between the QWs. The active region was grown on a 3 μm thick Si-doped n-type GaN layer, and was followed by a 20~30-nm-thick GaN spacer layer, an AlGaN EBL, and a p-type GaN cladding layer. The four MQW LEDs were distinguished by the number of QBs that were intentionally Si-doped. Doping was employed in 1, 2, 3, and 4 of the QBs, counting from the n-type GaN side. A barrier-doping level of $n \approx 3\times10^{18}$ cm$^{3}$ was determined by Hall-effect measurements of thick reference GaN layers grown under the same conditions as the doped QBs. The four LED wafers were processed into lateral LED chips, 300×300 μm$^2$ in size, and left unencapsulated. To obtain the L-I-V characteristics of the LEDs, devices were tested from each GaInN/GaN MQW wafer at room temperature and with currents up to 1000 mA. The current sweep was performed in pulsed mode with a 5 μs pulse duration and a 1% duty cycle to prevent self-heating.

Figure 3A:
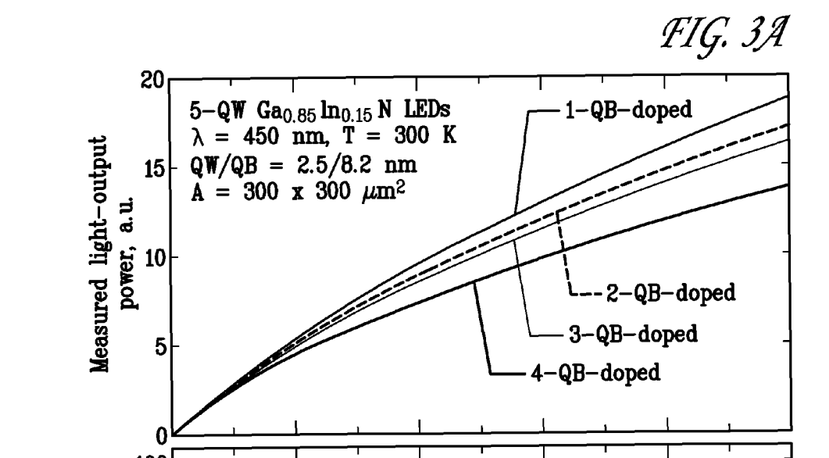
FIG. 3(a) is a graph of the measured light-output power as a function of forward current of LEDs with different number of doped QBs.
Figure 3B:
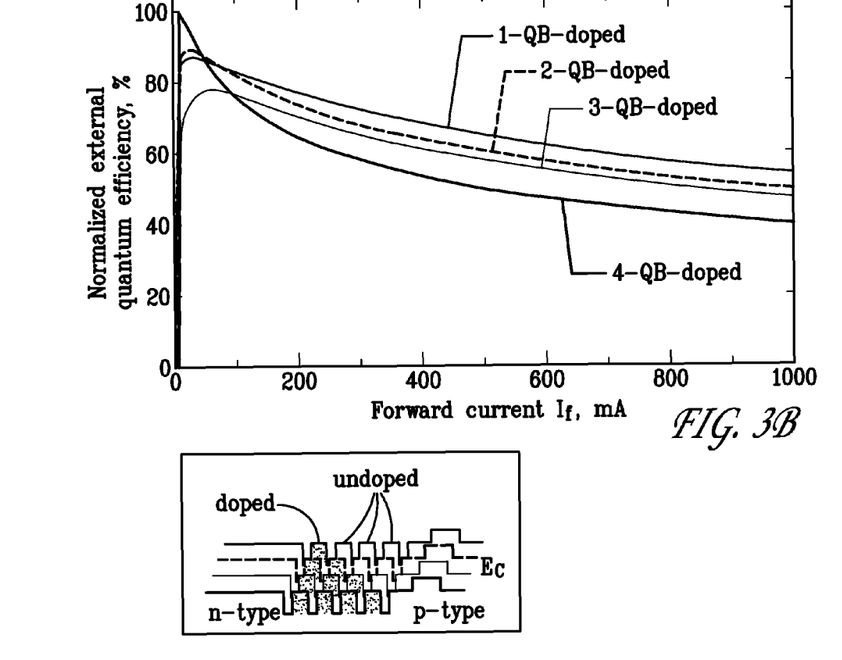
FIG. 3(b) is a graph of the measured external quantum efficiency (EQE) as a function of forward current of LEDs with different numbers of doped quantum barrier layers (QBs), normalized to the maximum EQE of the 4-QB-doped structure.

FIG. 3(a) shows the light-output power of the four LEDs as a function of the forward current $I_f$. The light-output power of all LEDs increases sublinearly with current. The 4-QB-doped sample shows the lowest light-output power at high currents (>100 mA). As fewer QBs are doped, the light-output power gradually increases. At the maximum forward current of 1000 mA, the 1-QB-doped LED has a 37.5% increase in the light-output power compared to the 4-QB-doped LED. The normalized external quantum efficiency (EQE) versus current is plotted in FIG. 3(b) for the four LED structures. The 4-QB-doped sample has a sharp peak in efficiency, which occurs at a current level below 10 mA; at higher currents, the efficiency rapidly decreases and drops to 40% of its peak value as the current reaches 1000 mA. In contrast, the efficiency peak becomes less sharp as fewer QBs are doped, and the EQE of the 1-QB-doped sample outperforms the 4-QB-doped sample at a current level as low as 50 mA. While the maximum efficiencies for the fewer-QB-doped LEDs (with 1, 2, and 3 doped QBs) are lower than that of the 4-QB-doped LEDs, the maximum efficiencies occur at higher forward currents. The efficiency droop of the fewer-QB-doped LED samples is dramatically reduced. However, as shown by Zhu et al., undoped barriers can lead to increased ideality factors and thus higher forward voltages under current injection.

Figure 4A:
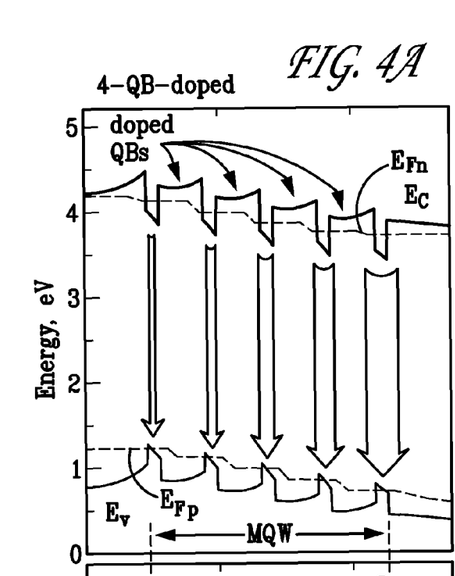
FIG. 4 shows the simulated band profiles and illustration of the distribution of radiative recombination (arrows) within the MQW of GaInN/GaN LEDs with (a) 4-QB-doped ($N_D=3\times10^{18}$ cm$^{-3}$) and (b) 1-QB-doped structures at a forward current of 1 A (current density ~1.1 kA/cm$^2$). Also shown are corresponding electron and hole concentrations in the MQW active region for the (c) 4-QB-doped and (d) 1-QB-doped structures.
Figure 4B:
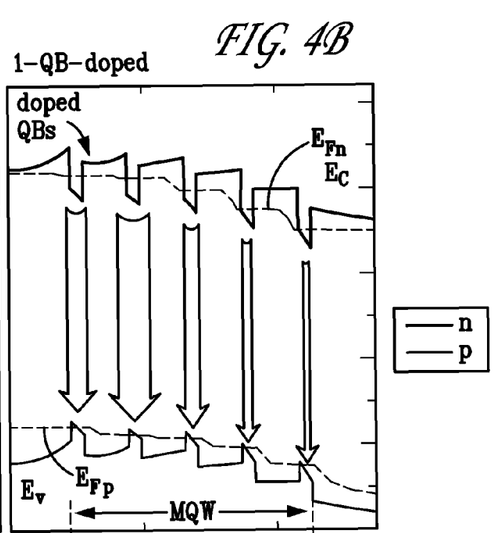
Figure 4C:
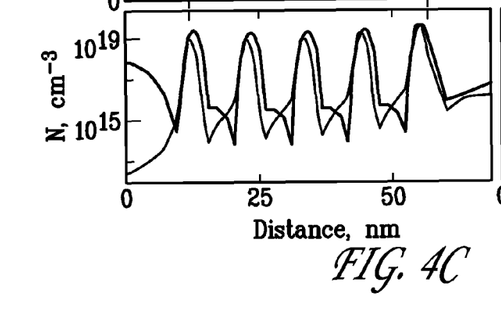
Figure 4D:
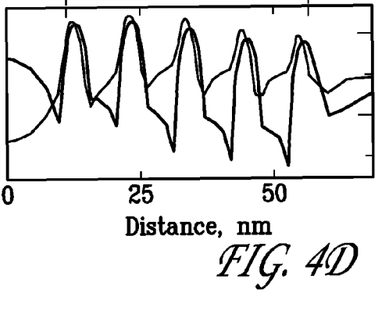
Figure 5:
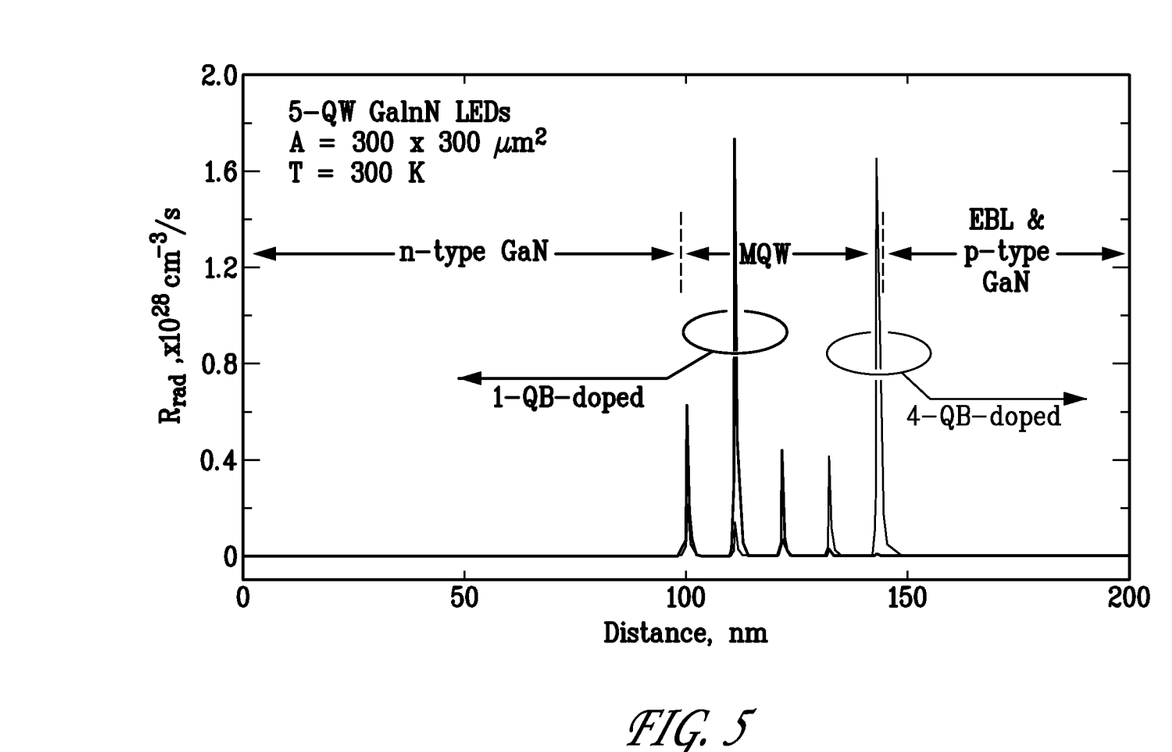
FIG. 5 shows the calculated distribution of radiative recombination in LEDs with 4-QB-doped and 1-QB-doped active-region structures.

To understand the mechanism responsible for the increase of high-current EQE and reduced efficiency droop with fewer doped QBs, numerical simulations of the LED structures were performed using APSYS modeling software. The simulation parameters can be found in Zhu et al. and the conduction-to-valence-band offset ratio is set to be 67:33. See D. Zhu et al., *Appl. Phys. Lett.* 94, 081113 (2009). The band diagrams corresponding to a forward current of 1000 mA for the 4-QB-doped and 1-QB-doped structures are plotted in FIGS. 4(a) and 4(b), respectively. All of the doped QBs have a Si impurity concentration of $N_D = 3 \times 10^{18}$ cm$^{-3}$. Doping the QBs n-type generally causes a positive curvature of the band edge of the QBs. The lower QB height presents less impedance for well-to-well electron transport. However, holes are impeded from propagating between QWs by the raised QBs in the valence band. Both the electron and hole concentrations are highest in the last QW, as shown in FIG. 4(c). This high concentration in the last QW can induce undesired electron leakage and other mechanisms including Auger recombination. Meanwhile, such an electron-favoring transport leads to the strongest radiative recombination in the last QW as depicted in FIG. 5. In contrast, when only the first QB is doped, the asymmetry of electron and hole transport is reduced. The maximum electron and hole concentration is shifted from the last QW to the second QW as shown in FIG. 4(d). Simulation indicates that this hole-favoring transport reduces electron leakage into the p-type GaN, and results in the second QW contributing the most to optical emission as shown in FIG. 5.

Figure 6A:
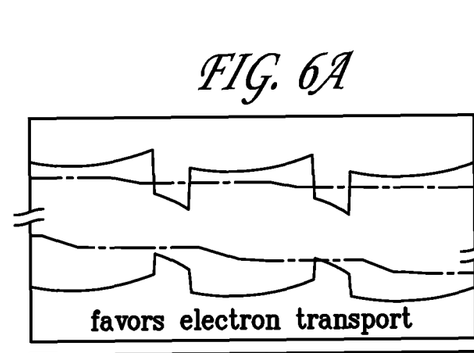
FIG. 6(a) shows a schematic illustration of the QB-doped structure ($N_D=6\times10^{18}$ cm$^{-3}$) that favors electron transport.
Figure 6B:
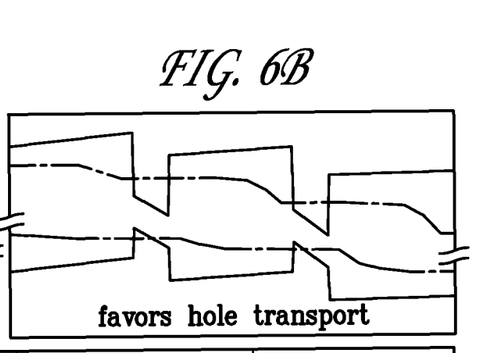
FIG. 6(b) shows a QB-undoped structure that favors hole transport. The gray shaded regions highlight key differences in the QB band profiles.
Figure 6C:
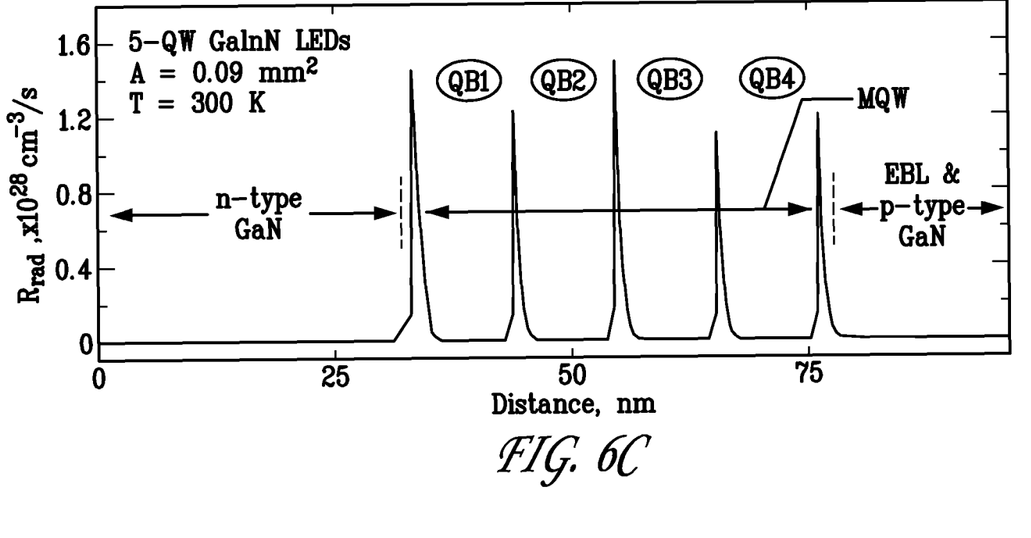
FIG. 6(c) shows that calculated radiative recombination showing that a uniform distribution of radiative recombination among the MQWs can be obtained by adjusting the doping in the QBs (QB1: $N_D=6\times10^{18}$ cm$^{-3}$; QB2: $N_D=2\times10^{18}$ cm$^{-3}$; QB3: $N_D=2\times10^{18}$ cm$^{-3}$; QB4: $N_D=1.4\times10^{18}$ cm$^{-3}$).

To minimize electron leakage, a uniform carrier transport and distribution in the MQWs is preferred. Such a uniform carrier distribution can indeed be attained in simulations by fine tuning the QB doping between electron-favoring transport, shown in FIG. 6(a), and hole-favoring transport, shown in FIG. 6(b). The gray shaded regions highlight key differences in the QB band profiles. FIG. 6(c) shows that calculated radiative recombination showing that a uniform distribution of radiative recombination among the MQWs can be obtained by adjusting the Si doping in the QBs (QB1: $N_D = 6 \times 10^{18}$ cm$^{-3}$; QB2: $N_o = 2 \times 10^{18}$ cm$^{-3}$; QB3: $N_D = 2 \times 10^{18}$ cm$^{-3}$; QB4: $N_o = 1.4 \times 10^{18}$ cm$^{-3}$). Therefore, by tailoring the Si-doping levels in the individual QBs according to the present invention, the carrier transport can be symmetrized and more evenly distribute carriers among the QWs, allowing for optimization of GaInN/GaN LEDs.

Tailored doping can provide more uniform carrier distributions than undoped barriers for III-Nitride LEDs, while still improving the ideality factor for lower voltage operation, as compared to undoped barrier designs. The tailored doping between barriers can be optimized using numerical simulations of the LED structures. Typically, the group IV donor impurity concentration can range from undoped to a dopant concentration as high as about $10^{19}$ cm$^{-3}$. Typically, the n-side barriers can be more heavily doped with donor impurity than the p-side barrier layers. Accordingly, the last barrier on the p-side can be undoped. Further, each barrier can have a graded doping profile to further optimize the carrier distributions. Use of donor impurity doping in the barriers can also provide an additional source of free carriers for improved device efficiency.

The present invention can be used to improve the efficiency droop of III-N LEDs, including GaN, InGaN, AlGaN, and AlInGaN MQW LEDs. The InGaN alloys have bandgaps that enable operation from near-UV to potentially near infra-red emission. AlGaN LED emission can potentially extend into the deep UV (e.g., 210 nm or longer). The quaternary alloys provide a broad range of bandgaps and can be benefitted by strain engineering. Further, whereas the above example described Si as the barrier dopant, other group IV dopants can also be used, including Ge.

Further, tailored doping of the barriers can be used to improve the performance of III-N laser diodes, specifically by reducing threshold current. Above threshold, stimulated emission is thought to effectively compete with non-radiative processes that can cause droop. However, this is not the case below threshold, such that efficiency droop can increase laser thresholds. Therefore, the reduction of efficiency droop may lower the threshold current.

The present invention has been described as a high efficiency III-Nitride light-emitting diode. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A III-Nitride light-emitting diode, comprising:
a multiple-quantum-well active region, comprising a plurality of alternating barrier layers surrounding a central quantum well layer, wherein at least two of the plurality of alternating barrier layers are doped with different donor impurity concentrations and wherein the different donor impurity concentrations of the at least two of the plurality of alternating barrier layers are tailored to symmetrize carrier transport and achieve uniform carrier distribution among the multiple-quantum-wells.

2. The III-Nitride light-emitting diode of claim 1, wherein the central quantum well layer comprises GaN, InGaN, AlGaN, or AlInGaN.

3. The III-Nitride light-emitting diode of claim 1, wherein the barrier layers comprise GaN, GaInN, AlGaN, or AlGaInN.

4. The III-Nitride light-emitting diode of claim 1, wherein the donor impurity comprises a group IV element.

5. The III-Nitride light-emitting diode of claim 4, wherein the group IV element comprises silicon or germanium.

6. The III-Nitride light-emitting diode of claim 1, wherein one of the at least two of the plurality of alternating barrier layers is undoped.

7. The III-Nitride light-emitting diode of claim 1, wherein the different donor impurity concentrations are less than $N_D = 10^{19}$ cm$^{-3}$.

8. The III-Nitride light-emitting diode of claim 1, wherein the donor impurity concentration within at least one of the alternating barrier layers is graded.

9. The III-Nitride light-emitting diode of claim 1, further comprising an n-type layer cladding a side of the active region and a p-type layer cladding the other side of the active region.

10. The III-Nitride light-emitting diode of claim 9, wherein an n-side barrier layer of the at least two of the plurality of alternating barrier layers is doped with a higher donor impurity concentration than the adjacent p-side barrier layer.

11. The III-Nitride light-emitting diode of claim 9, wherein the barrier layer closest to the p-type layer is undoped.

12. The III-Nitride light-emitting diode of claim 9, wherein the n-type layer comprises n-type GaN and athe p-type layer comprises p-type GaN.

13. A III-Nitride laser diode, comprising:
a multiple-quantum-well active region, comprising a plurality of alternating barrier layers surrounding a central quantum well layer, wherein at least two of the plurality of alternating barrier layers are doped with different donor impurity concentrations and wherein the different donor impurity concentrations of the at least two of the plurality of alternating barrier layers are tailored to symmetrize carrier transport and achieve uniform carrier distribution between the multiple-quantum-wells, thereby reducing threshold current.

* * * * *